(12) United States Patent
Song

(10) Patent No.: US 11,950,451 B2
(45) Date of Patent: Apr. 2, 2024

(54) VIEWING ANGLE SWITCHABLE DISPLAY DEVICE INCLUDING INTEGRATED LENS

(71) Applicant: LG Display Co., Ltd., Seoul (KR)

(72) Inventor: Tae-Joon Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/060,497

(22) Filed: Nov. 30, 2022

(65) Prior Publication Data

US 2023/0217691 A1 Jul. 6, 2023

(30) Foreign Application Priority Data

Dec. 30, 2021 (KR) ........................ 10-2021-0192433

(51) Int. Cl.
*H10K 50/858* (2023.01)
*G02B 3/00* (2006.01)
(Continued)

(52) U.S. Cl.
CPC ......... *H10K 50/858* (2023.02); *G02B 3/0037* (2013.01); *G02B 3/06* (2013.01); *G06F 3/0412* (2013.01); *G09G 3/3233* (2013.01); *H10K 59/126* (2023.02); *G09G 2300/0426* (2013.01); *G09G 2300/0842* (2013.01); *G09G 2300/0861* (2013.01); *G09G 2320/068* (2013.01); *G09G 2354/00* (2013.01)

(58) Field of Classification Search
CPC .. H10K 59/12; H10K 59/131; H10K 59/1213; G09G 3/3233; G09G 3/30; G09G 2300/0861; G09G 2300/0426; G09G 3/32; G09G 3/003; G09G 2320/0233; G09G 3/3648; G09G 2320/028; G09G 2320/068; G02B 30/27; G02B 3/0056; G02B 27/0172; G02B 5/045; G02B 27/123; G02B 27/1066; G02B 19/0066; G02B 3/0006; G02B 19/0061; G02B 2027/0123; G02B 2027/0127; G02B 27/0966; G02B 13/18; G02B 6/003; G02B 13/0035; G02B 13/0045; G02B 2003/0093; G02F 1/133526
See application file for complete search history.

(56) References Cited

U.S. PATENT DOCUMENTS

2015/0144925 A1   5/2015   Baek et al.
2017/0200412 A1*  7/2017   Gu ...................... G09G 3/3266
(Continued)

FOREIGN PATENT DOCUMENTS

| KR | 20150061558 A | | 6/2015 | |
| KR | 20190011372 A | | 2/2019 | |
| KR | 20230018836 A | * | 5/2022 | ....... B29D 11/00365 |

*Primary Examiner* — Sanjiv D. Patel
(74) *Attorney, Agent, or Firm* — Seed IP Law Group LLP

(57) ABSTRACT

A viewing angle switchable display device includes: a substrate having at least one subpixel; a plurality of transistors in the at least one subpixel on the substrate; first and second light emitting diodes in the at least one subpixel on the substrate, the first and second light emitting diodes connected to two, respectively, of the plurality of transistors; and an integrated lens on the first and second light emitting diodes, the integrated lens including a half cylindrical lens corresponding to the first light emitting diode and a half spherical lens corresponding to the second light emitting diode.

19 Claims, 5 Drawing Sheets

(51) Int. Cl.
*G02B 3/06* (2006.01)
*G06F 3/041* (2006.01)
*G09G 3/3233* (2016.01)
*H10K 59/126* (2023.01)

(56) References Cited

U.S. PATENT DOCUMENTS

| | | |
|---|---|---|
| 2019/0025571 A1 | 1/2019 | Lee |
| 2021/0202917 A1* | 7/2021 | Lee ..................... H10K 50/844 |
| 2022/0163699 A1* | 5/2022 | Zhang .................. G02B 3/0043 |
| 2022/0199013 A1* | 6/2022 | Matsueda ............ G09G 3/3233 |

* cited by examiner

|  | comparison example | embodiment | |
|---|---|---|---|
|  |  | SL | CL |
| emission area | 100% | 32.5% | 67.5% |
| efficiency of lens (327%/165%) | X | 106.3% | 111.4% |
| transmittance of encapsulating layer(90%) | 90% | 95.7% | 100.2% |
| transmittance of polarizing layer(45%) | 40.5% | 43.0% | 45.1% |
| transmittance of view switching film(70%) | 28.4% | X | X |
| transmittance of light control film(80%) | 22.7% | X | X |
| final emission ratio | 22.7% | 43.0% | 45.1% |
| expectation luminance | 672nit | 1275.3nit | 1336.3nit |

VIEWING ANGLE SWITCHABLE DISPLAY DEVICE INCLUDING INTEGRATED LENS

CROSS-REFERENCE TO RELATED APPLICATION

The present application claims the priority of Korean Patent Application No. 10-2021-0192433 filed on Dec. 30, 2021, which is hereby incorporated by reference in its entirety.

BACKGROUND

Technical Field

The present disclosure relates to a display device, and more particularly, to a viewing angle switchable display device including an integrated lens of a half cylindrical lens having a rounded edge and a half spherical lens.

Description of the Related Art

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has advantages in a viewing angle, a contrast ratio and a power consumption to be applied to various fields.

Specifically, the OLED display device may be used for a dashboard of a vehicle. In a field of a vehicle, a viewing angle switchable OLED display device has been researched and developed so that a driver and a passenger can selectively watch an image.

In the viewing angle switchable OLED display device, a viewing angel of an image is switched using a view switching film and a light control film.

BRIEF SUMMARY

The inventors have realized that, since additional films are added, a luminance is reduced and a fabrication cost increases. Further, it is difficult to develop a view switching film for stable usage in a vehicle field.

Accordingly, the present disclosure is directed to a viewing angle switchable display device including an integrated lens that substantially obviates one or more of the problems due to limitations and disadvantages described above.

A technical benefit of the present disclosure is to provide a viewing angle switchable display device including an integrated lens where a luminance increases and a fabrication cost is reduced by disposing the integrated lens of a half cylindrical lens having a rounded edge and a half spherical lens on first and second light emitting diodes.

Another technical benefit of the present disclosure is to provide a viewing angle switchable display device including an integrated lens where an aperture ratio is improved and a luminance increases by integrating a half cylindrical lens having a rounded edge and a half spherical lens with a light shielding pattern interposed therebetween as the integrated lens.

Additional features and aspects will be set forth in the description that follows, and in part will be apparent from the description, or may be learned by practice of the present disclosure provided herein. Other features and aspects of the embodiments may be realized and attained by the structure particularly pointed out in the written description, or derivable therefrom, and the claims hereof as well as the appended drawings.

To achieve these and other aspects of the present disclosure, as embodied and broadly described herein, a viewing angle switchable display device includes: a substrate having at least one subpixel; a plurality of transistors in the at least one subpixel on the substrate; a first light emitting diode and a second light emitting diode in the at least one subpixel on the substrate, the first and second light emitting diodes connected to two, respectively, of the plurality of transistors; and an integrated lens on the first and second light emitting diodes, the integrated lens including a half cylindrical lens corresponding to the first light emitting diode and a half spherical lens corresponding to the second light emitting diode.

It is to be understood that both the foregoing general description and the following detailed description are examples and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Reference will now be made in detail to aspects of the disclosure, example embodiments of which are illustrated in the accompanying drawings.

Figure 1:
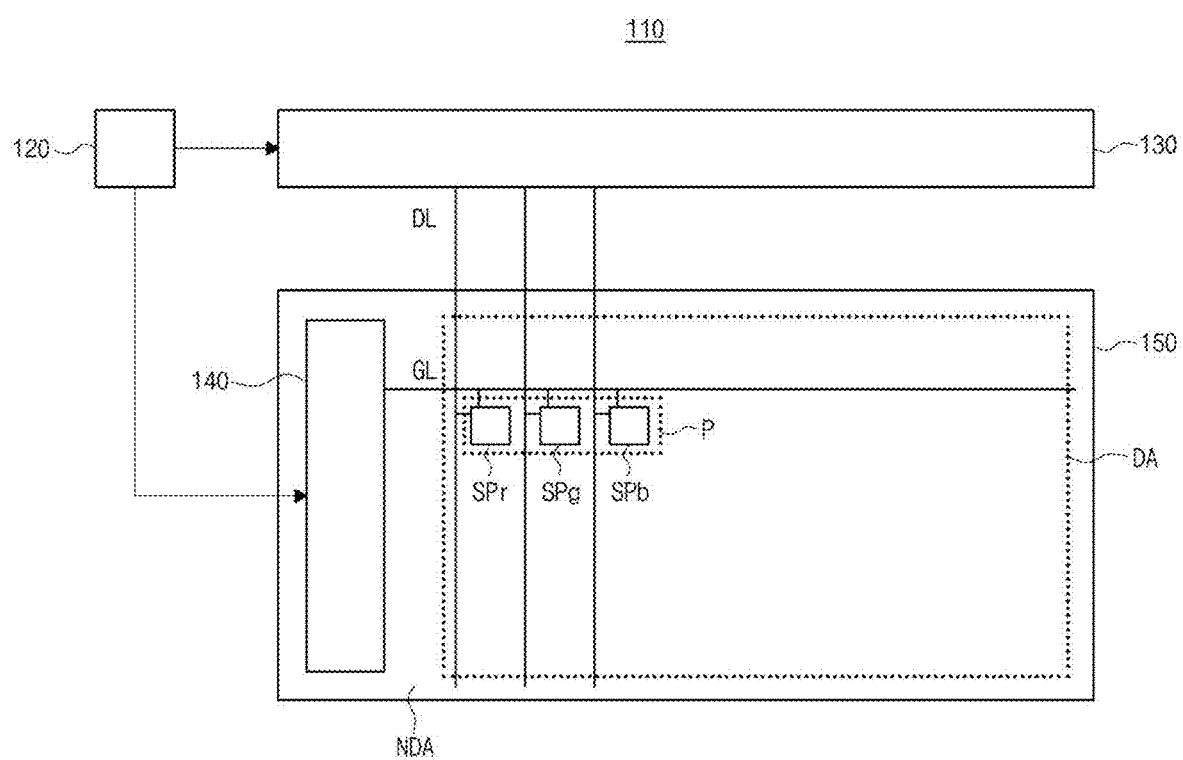
FIG. 1 is a plan view showing a viewing angle switchable display device according to an embodiment of the present disclosure.

FIG. 1 is a plan view showing a viewing angle switchable display device according to an embodiment of the present disclosure. The display device may be an organic light emitting diode (OLED) display device.

In FIG. 1, a viewing angle switchable display device 110 according to an embodiment of the present disclosure includes a timing controlling unit or circuit 120, a data driving unit or circuit 130, a gate driving unit or circuit 140 and a display panel 150.

The timing controlling unit 120 generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 130, and the gate control signal is transmitted to the gate driving unit 140.

The data driving unit 130 generates a data signal (data voltage) using the data control signal and the image data transmitted from the timing controlling unit 120 and transmits the data signal to a data line DL of the display panel 150.

The gate driving unit 140 generates a gate signal (gate voltage) and an emission signal using the gate control signal transmitted from the timing controlling unit 120 and transmits the gate signal and the emission signal to a gate line GL of the display panel 150.

The gate driving unit 140 may have a gate in panel (GIP) type to be formed in a non-display area NDA of a substrate of the display panel 150 having the gate line GL, the data line DL and a pixel P.

The display panel 150 includes a display area DA at a central portion thereof and a non-display area NDA surrounding the display area DA. The display panel 150 displays an image using the gate signal, the emission signal and the data signal. For displaying an image, the display panel 150 includes a plurality of pixels P, a plurality of gate lines GL and a plurality of data lines DL in the display area DA.

Each of the plurality of pixels P includes red, green and blue subpixels SPr, SPg and SPb, and the gate line GL and the data line DL cross each other at respective regions corresponding to the red, green and blue subpixels SPr, SPg and SPb. Each of the red, green and blue subpixels SPr, SPg and SPb is connected to the gate line GL and the data line DL.

When the viewing angle switchable display device 110 is an OLED display device, each of the red, green and blue subpixels SPr, SPg and SPb may include a plurality of transistors such as a switching transistor, a driving transistor and a sensing transistor, a storage capacitor and a light emitting diode.

A structure and an operation of the display panel 150 of the viewing angle switchable display device 110 may be illustrated with reference to drawings.

Figure 2:
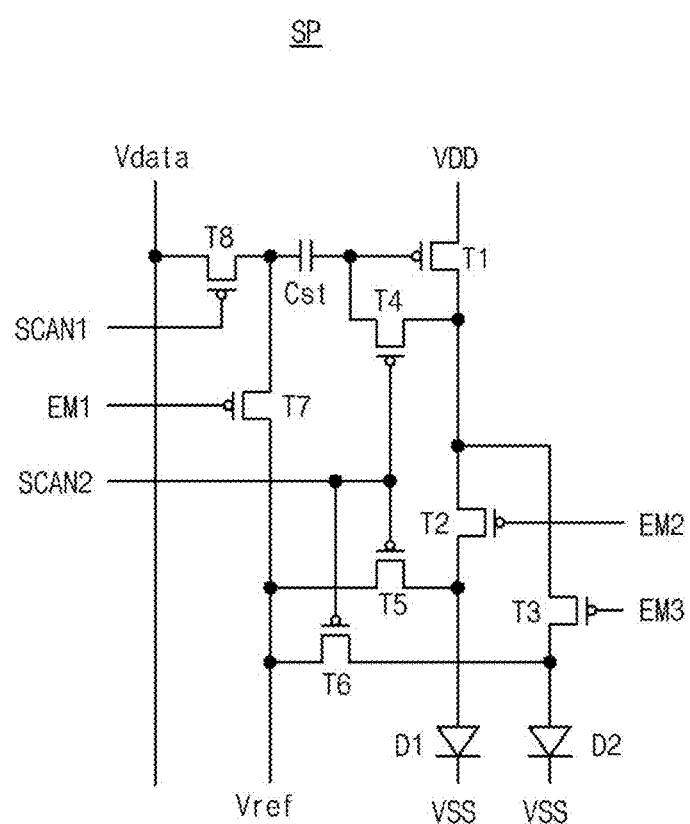
FIG. 2 is a circuit diagram showing a subpixel of a viewing angle switchable display device according to an embodiment of the present disclosure.

FIG. 2 is a circuit diagram showing a subpixel of a viewing angle switchable display device according to an embodiment of the present disclosure.

In FIG. 2, each of the red, green and blue subpixels SPr, SPg and SPb (SP) of the display panel 150 of the viewing angle switchable display device 110 includes first to eighth transistors T1 to T8, a storage capacitor Cst and first and second light emitting diodes D1 and D2.

For example, the first to eighth transistors T1 to T8 may have a positive type.

The first transistor T1 of a driving transistor is switched (turned on and off) according to a voltage of a first electrode of the storage capacitor Cst. A gate electrode of the first transistor T1 is connected to the first electrode of the storage capacitor Cst and a drain electrode of the fourth transistor T4, a source electrode of the first transistor T1 is connected to a high level voltage VDD, and a drain electrode of the first transistor T1 is connected to a source electrode of the fourth transistor T4, a source electrode of the second transistor T2 and a source electrode of the third transistor T3.

The second transistor T2 of an emission transistor is switched according to a second emission signal EM2. A gate electrode of the second transistor T2 is connected to the second emission signal EM2, the source electrode of the second transistor T2 is connected to the drain electrode of the first transistor T1, the source electrode of the fourth transistor T4 and the source electrode of the third transistor T3, and a drain electrode of the second transistor T2 is connected to a source electrode of the fifth transistor T5 and an anode of the first light emitting diode D1.

The third transistor T3 of an emission transistor is switched according to a third emission signal EM3. A gate electrode of the third transistor T3 is connected to the third emission signal EM3, the source electrode of the third transistor T3 is connected to the drain electrode of the first transistor T1, the source electrode of the fourth transistor T4 and the source electrode of the second transistor T2, and a drain electrode of the third transistor T3 is connected to a source electrode of the sixth transistor T6 and an anode of the second light emitting diode D2.

The fourth transistor T4 is switched according to a gate2 signal SCAN2 (or "second gate signal SCAN2"). A gate electrode of the fourth transistor T4 is connected to the gate2 signal SCAN2, the source electrode of the fourth transistor T4 is connected to the drain electrode of the first transistor T1, the source electrode of the second transistor T2 and the source electrode of the third transistor T3, and the drain electrode of the fourth transistor T4 is connected to the gate electrode of the first transistor T1 and the first electrode of the storage capacitor Cst.

The fifth transistor T5 is switched according to the gate2 signal SCAN2. A gate electrode of the fifth transistor T5 is connected to the gate2 signal SCAN2, the source electrode of the fifth transistor T5 is connected to the drain electrode of the second transistor T2 and the anode of the first light emitting diode D1, and a drain electrode of the fifth transistor T5 is connected to a drain electrode of the seventh transistor T7, a drain electrode of the sixth transistor T6 and a reference signal Vref.

The sixth transistor T6 is switched according to the gate2 signal SCAN2. A gate electrode of the sixth transistor T6 is connected to the gate2 signal SCAN2, the source electrode of the sixth transistor T6 is connected to the drain electrode of the third transistor T3 and the anode of the second light emitting diode D2, and a drain electrode of the sixth transistor T6 is connected to the drain electrode of the seventh transistor T7, the drain electrode of the fifth transistor T5 and the reference signal Vref.

The seventh transistor T7 is switched according to a first emission signal EM1. A gate electrode of the seventh transistor T7 is connected to the first emission signal EM1, a source electrode of the seventh transistor T7 is connected to a second electrode of the storage capacitor Cst and a source electrode of the eighth transistor T8, and the drain electrode of the seventh transistor T7 is connected to the drain electrode of the fifth transistor T5 and the drain electrode of the sixth transistor T6.

The eighth transistor T8 of a switching transistor is switched according to the gate1 signal SCAN1 (or "first gate signal SCAN1"). A gate electrode of the eighth transistor T8 is connected to the gate1 signal SCAN1, the source electrode of the eighth transistor T8 is connected to the second electrode of the storage capacitor Cst and the source electrode of the seventh transistor T7, and a drain electrode of the eighth transistor T8 is connected to the data signal Vdata.

The storage capacitor Cst stores the data signal Vdata and a threshold voltage Vth. The first electrode of the storage capacitor Cst is connected to the gate electrode of the first transistor T1 and the drain electrode of the fourth transistor T4, and the second electrode of the storage capacitor Cst is connected to the source electrode of the seventh transistor T7 and the source electrode of the eighth transistor T8.

The first light emitting diode D1 is connected between the second and fifth transistors T2 and T5 and the low level voltage VSS and emits a light proportional to a current of the first transistor T1. The anode of the first light emitting diode D1 is connected to the drain electrode of the second transistor T2 and the source electrode of the fifth transistor T5, and the cathode of the first light emitting diode D1 is connected to the low level voltage VSS. The first light emitting diode D1 is disposed to correspond to a half cylindrical lens CL (of FIG. 3) having a rounded edge of an integrated lens IL (of FIG. 3). The first light emitting diode D1 has an ON state to obtain a wide view mode along the left-right direction and has an OFF state to obtain a narrow view mode along the left-right direction.

The second light emitting diode D2 is connected between the third and sixth transistors T3 and T6 and the low level voltage VSS and emits a light proportional to the current of the first transistor T1. The anode of the second light emitting diode D2 is connected to the drain electrode of the third transistor T3 and the source electrode of the sixth transistor T6, and the cathode of the second light emitting diode D2 is connected to the low level voltage VSS. The second light emitting diode D2 is disposed to correspond to a half spherical lens SL (of FIG. 3) of the integrated lens IL. The second light emitting diode D2 has an ON state and an OFF state to obtain a narrow view mode along the left-right direction.

The first and second light emitting diodes D1 and D2 are connected to the second and third transistors T2 and T3, respectively, and emit a light according to second and third emission signals EM2 an EM3, respectively, to be driven independently.

The subpixel SP may be driven in an initialization period, a sensing period, a holding period and an emission period.

During the initialization period, the seventh and eighth transistors T7 and T8 are turned on and the fourth, fifth and sixth transistors T4, T5 and T6 are turned off. The second electrode of the storage capacitor Cst becomes the reference signal Vref such that the gate electrode of the first transistor T1 is initialized.

During the sensing period, the fourth, fifth, sixth and eighth transistors T4, T5, T6 and T8 are turned on, and the seventh transistor T7 is turned off. The second electrode of the storage capacitor Cst becomes the data signal Vdata, and the first electrode of the storage capacitor Cst becomes a sum (Vdata−Vref+Vth) of a difference (Vdata−Vref) between the data signal Vdata and the reference voltage Vref and the threshold voltage Vth such that the threshold voltage Vth is stored in the storage capacitor Cst.

During the holding period, the fourth, fifth, sixth, seventh and eighth transistors T4, T5, T6, T7 and T8 are turned off. The second electrode of the storage capacitor Cst is kept as the data signal Vdata, and the first electrode of the storage capacitor Cst is kept as the sum (Vdata−Vref+Vth) of a difference (Vdata−Vref) between the data signal Vdata and the reference voltage Vref and the threshold voltage Vth.

During the emission period, the fourth, fifth, sixth and eighth transistors T4, T5, T6 and T8 are turned off, and the seventh transistor T7 is turned on. A current proportional to a square of a value ((Vdata−Vref+Vth−VDD)−Vth=Vdata−Vref−VDD) obtained by subtracting the threshold voltage Vth from a gate-source voltage Vgs flows through the first transistor T1, and the first and second light emitting diodes D1 and D2 emit a light having a luminance corresponding to the current flowing through the first transistor T1 according to ON and OFF states of the second and third transistors T2 and T3.

Although the subpixel SP exemplarily includes eight transistors, one storage capacitor and two light emitting diodes in an embodiment of FIG. 2, a subpixel may include transistors smaller than eight or greater than eight in another embodiment.

For example, a subpixel may include nine transistors, one storage capacitor and two light emitting diodes or may include twelve transistors, one storage capacitor and two light emitting diodes in another embodiment.

A cross-sectional structure of the viewing angle switchable display device 110 may be illustrated with reference to a drawing.

Figure 3:
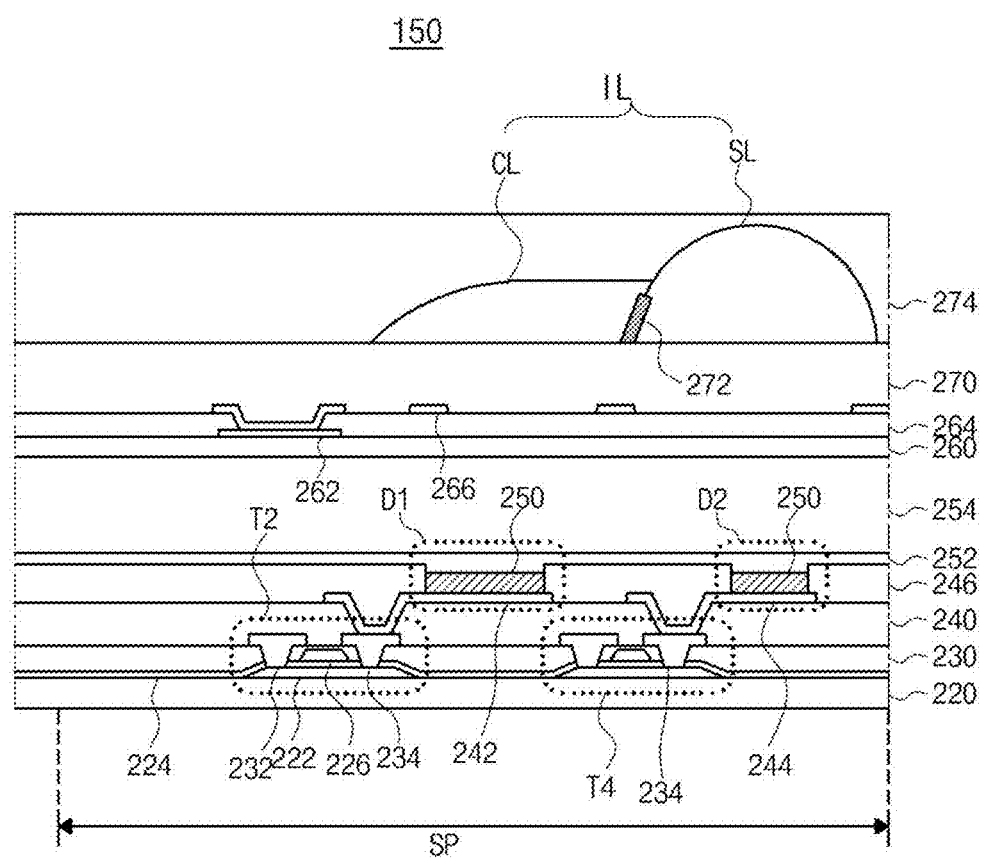
FIG. 3 is a cross-sectional view showing a viewing angle switchable display device according to an embodiment of the present disclosure.

FIG. 3 is a cross-sectional view showing a viewing angle switchable display device according to an embodiment of the present disclosure.

In FIG. 3, the display panel 150 of the viewing angle switchable display device 110 according to an embodiment of the present disclosure includes the plurality of subpixels SP.

A semiconductor layer 222 is disposed on a substrate 220, and a gate insulating layer 224 is disposed on the semiconductor layer 222 and the entire substrate 220.

The semiconductor layer 222 may include a semiconductor material such as silicon or an oxide semiconductor material, and the gate insulating layer 224 may include an inorganic insulating material such as silicon oxide ($SiO_2$) and silicon nitride ($SiN_x$). When the semiconductor layer 222 includes polycrystalline silicon, the semiconductor layer 222 may include an active region at a central portion thereof and a source-drain region at both end portions thereof.

The semiconductor layer 222 may correspond to areas for the first to eighth transistors T1 to T8.

A gate electrode 226 is disposed on the gate insulating layer 224 over the semiconductor layer 222, and a first interlayer insulating layer 230 is disposed on the gate electrode 226 and the entire gate insulating layer 224.

The gate electrode 226 may include a metallic material such as aluminum (Al) and molybdenum (Mo), and the first interlayer insulating layer 230 may include an inorganic insulating material such as silicon oxide ($SiO_2$) and silicon nitride ($SiN_x$).

A source electrode 232 and a drain electrode 234 are disposed on the first interlayer insulating layer 230 over the semiconductor layer 222, and a second interlayer insulating layer 240 is disposed on the source and drain electrodes 232 and 234 and the entire first interlayer insulating layer 230.

The source and drain electrodes 232 and 234 may include a metallic material such as aluminum (Al) and molybdenum (Mo), and the second interlayer insulating layer 240 may include an inorganic insulating material such as silicon oxide ($SiO_2$) and silicon nitride ($SiN_x$).

The source and drain electrodes 232 and 234 may be connected to both end portions of the semiconductor layer 222 through contract holes in the first interlayer insulating layer 230 and the gate insulating layer 224.

The semiconductor layer 222, the gate electrode 226, the source electrode 232 and the drain electrode 234 constitute each of the first to eighth transistors T1 to T8.

First and second anodes 242 and 244 are disposed on the second interlayer insulating layer 240, and a bank 246 is disposed on the first and second anodes 242 and 244.

The first and second anodes 242 and 244 may have a triple layer of a transparent conductive material such as indium tin oxide (ITO) and a metallic material such as an alloy of silver palladium copper (APC). The bank 246 may include an organic insulating material such as polyimide (PI).

The first and second anodes 242 and 244 may be connected to the drain electrodes of the second and fourth transistors T2 and T4, respectively.

The bank 246 may cover an edge portion of each of the first and second anodes 242 and 244 and may have an opening exposing a central portion of each of the first and second anodes 242 and 244.

An emitting layer 250 is disposed on each of the first and second anodes 242 and 244 exposed through the opening of the bank 246, and a cathode 252 is disposed on the emitting layer 250 and the entire bank 246.

The emitting layer 250 may emit red, green and blue colored lights in the red, green and blue subpixels SPr, SPg and SPb, respectively, and the low level voltage VSS may be applied to the cathode 252.

The first anode 242, the emitting layer 250 and the cathode 252 constitute the first light emitting diode D1, and the second anode 244, the emitting layer 250 and the cathode 252 constitute the second light emitting diode D2.

An encapsulating layer 254 is disposed on the entire cathode 252, and a first touch insulating layer 260 is disposed on the entire encapsulating layer 254.

The encapsulating layer 254 is disposed may include a plurality of inorganic material layers and a plurality of organic material layers alternately laminated with each other, and the first touch insulating layer 260 may include an inorganic insulating material such as silicon oxide ($SiO_2$) and silicon nitride ($SiN_x$).

A first touch electrode 262 is disposed on the first touch insulating layer 260, and a second touch insulating layer 264 is disposed on the entire first touch electrode 262.

The first touch electrode 262 may include a metallic material such as aluminum (Al) and molybdenum (Mo), and the second touch insulating layer 264 may include an inorganic insulating material such as silicon oxide ($SiO_2$) and silicon nitride ($SiN_x$).

A second touch electrode 266 is disposed on the second touch insulating layer 264, and a first planarizing layer 270 is disposed on the entire second touch electrode 266.

The second touch electrode 266 may include a metallic material such as aluminum (Al) and molybdenum (Mo), and the first planarizing layer 270 may include an organic insulating material such as photoacryl.

The integrated lens IL is disposed on the first planarizing layer 270 over the first and second anodes 242 and 244, and a second planarizing layer 274 is disposed on the integrated lens IL an the entire first planarizing layer 270.

The integrated lens IL includes the half cylindrical lens CL having a rounded edge, the half spherical lens SL and a light shielding pattern 272 between the half cylindrical lens CL and the half spherical lens SL. The half cylindrical lens CL and the half spherical lens SL may be disposed to cover the first and second anodes 242 and 244 of the first and second light emitting diodes D1 and D2, respectively, and the light shielding pattern 272 may be disposed at an interface between the half cylindrical lens CL and the half spherical lens SL.

The first and second anodes 242 and 244 of the first and second light emitting diodes D1 and D2 may have plane shapes corresponding to the half cylindrical lens CL and the half spherical lens SL, respectively, of the integrated lens IL.

For example, the first anode 242 and the half cylindrical lens CL may have a plane shape of a rectangle having one concave side, and the second anode 244 and the half spherical lens SL may have a plane shape of a circle.

Although not shown, a polarizing layer including a linear polarizing layer and a retardation layer may be disposed on the second planarizing layer 274. The polarizing layer may convert a polarization state of an external light incident to the display panel 150 to prevent the external light from being emitted to an exterior.

An operation of the display panel 150 of the viewing angle switchable display device 110 in each mode may be illustrated with reference to a drawing.

Figure 4:
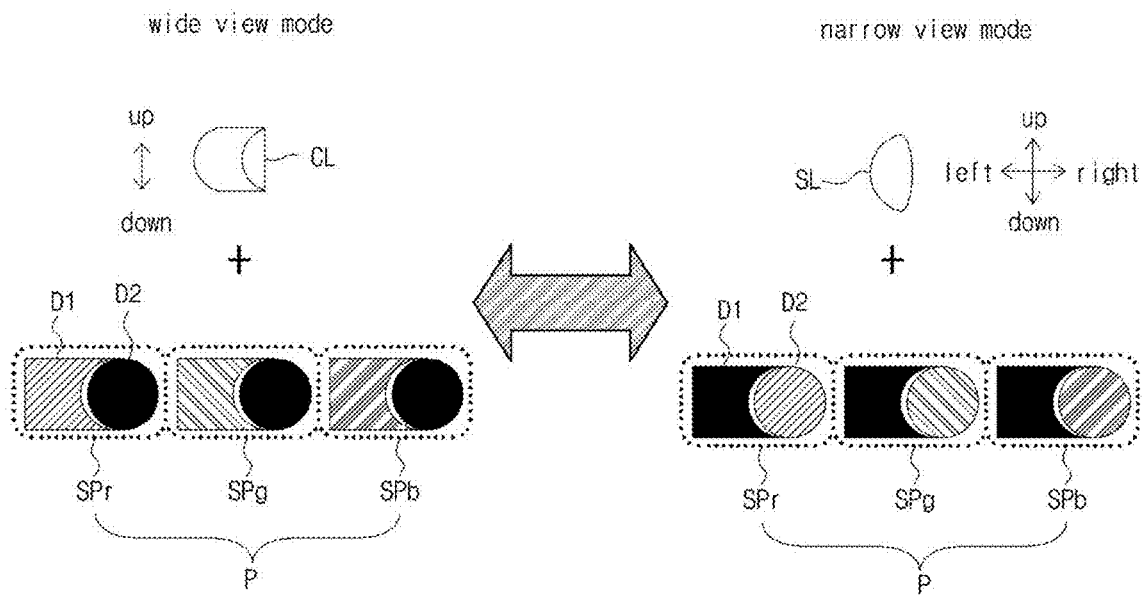
FIG. 4 is a view showing operations of a wide view mode and a narrow view mode of a pixel of a display panel of a viewing angle switchable display device according to an embodiment of the present disclosure.

FIG. 4 is a view showing operations of a wide view mode and a narrow view mode of a pixel of a display panel of a viewing angle switchable display device according to an embodiment of the present disclosure.

In FIG. 4, each of the red, green and blue subpixels SPr, SPg and SPb of the pixel P of the display panel 150 of the viewing angle switchable display device 110 according to an embodiment of the present disclosure includes the first and second light emitting diodes D1 and D2 and the integrated lens IL. The integrated lens IL includes the half cylindrical lens CL having a rounded edge portion corresponding to the first light emitting diode D1 and the half spherical lens SL corresponding to the second light emitting diode D2.

Since a circular round surface of the half cylindrical lens CL is disposed along an up-down direction, an incident light from a lower portion is focused to a central portion of the up-down direction and is not focused to a central portion of a left-right direction.

The up-down direction is a direction connecting upper and lower portions of the viewing angle switchable display device 110 when the display panel 150 is viewed at a front, and the left-right direction is a direction connecting left and right portions of the viewing angle switchable display device 110 when the display panel 150 is viewed at a front. The up-down direction and the left-right direction cross each other.

Since a circular round surface of the half spherical lens SL is disposed along the up-down and left-right directions, an incident light from a lower portion is focused to a central portion of the up-down and left-right directions.

When the display panel 150 is driven in a wide view mode, the first light emitting diode D1 in each of the red, green and blue subpixels SPr, SPg and SPb has an ON state to emit a light, and the second light emitting diode D2 in each of the red, green and blue subpixels SPr, SPg and SPb has an OFF state not to emit a light.

The light of the first light emitting diode D1 is focused along the up-down direction through the half cylindrical lens CL of the integrated lens IL. Further, the light of the first light emitting diode D1 is not focused and is diffused along the left-right direction through the half cylindrical lens CL of the integrated lens IL to be emitted from the display panel 150. As a result, the viewing angle switchable display device 110 displays an image having a narrow viewing angle along the up-down direction and a wide viewing angle along the left-right direction.

When the display panel 150 is driven in a narrow view mode, the first light emitting diode D1 in each of the red, green and blue subpixels SPr, SPg and SPb has an OFF state not to emit a light, and the second light emitting diode D2 in each of the red, green and blue subpixels SPr, SPg and SPb has an ON state to emit a light.

The light of the second light emitting diode D2 is focused along the up-down and left-right directions through the half spherical lens SL of the integrated lens IL to be emitted from the display panel 150. As a result, the viewing angle switchable display device 110 displays an image having a narrow viewing angle along the up-down and left-right directions.

The viewing angle switchable display device 110 displays an image having a wide viewing angle along the left-right direction in the wide view mode and displays an image having a narrow viewing angle along the left-right direction in the narrow view mode. As a result, both of a driver and a passenger may watch an image in the wide view mode, and one of a driver and a passenger may watch an image in the narrow view mode.

Further, since the viewing angle switchable display device 110 displays an image having a narrow viewing angle along the up-down direction in the wide view and narrow view modes, a visual disturbance in driving due to reflection of the image at a car's windshield is prevented.

A structure of the integrated lens IL of the viewing angle switchable display device 110 may be illustrated with reference to drawings.

Figure 5:
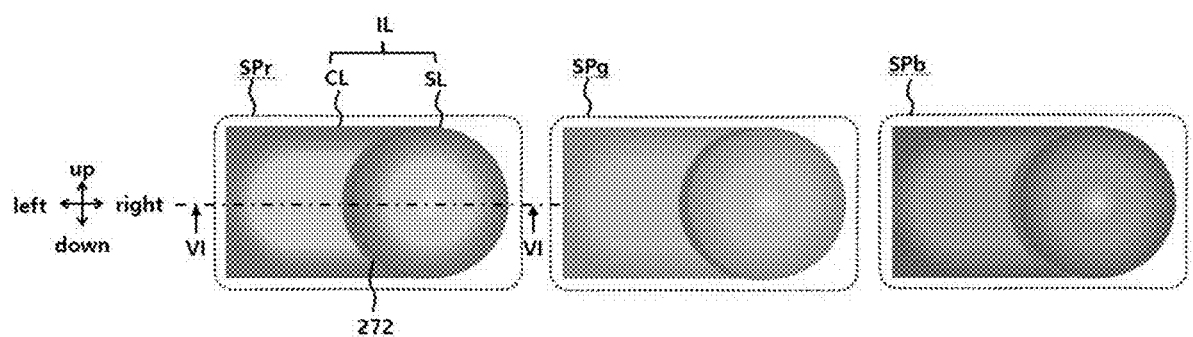
FIG. 5 is a plan view showing an integrated lens of a viewing angle switchable display device according to an embodiment of the present disclosure.
Figures 6, 7:
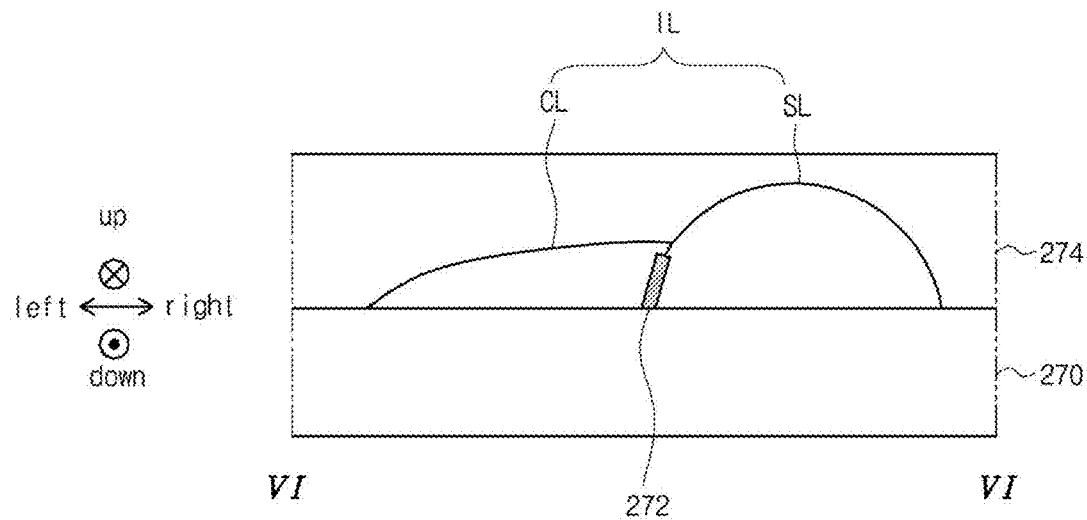
FIG. 6 is a cross-sectional view taken along a line IV-IV of FIG. 5.
FIG. 7 is a table showing a luminance of a viewing angle switchable display device according to an embodiment of the present disclosure.

FIG. 5 is a plan view showing an integrated lens of a viewing angle switchable display device according to an embodiment of the present disclosure, and FIG. 6 is a cross-sectional view taken along a ling IV-IV of FIG. 5.

In FIGS. 5 and 6, the integrated lens IL is disposed on the first planarizing layer 270, and the second planarizing layer 274 is disposed on the integrated lens IL in each of the red, green and blue subpixels SPr, SPg and SPb of the pixel P of the display panel 150 of the viewing angle switchable display device 110. A refractive index of the integrated lens IL may be greater than a refractive index of the second planarizing layer 274.

The integrated lens IL includes the half cylindrical lens CL having a rounded edge portion, the half spherical lens SL and a light shielding pattern 272 between the half cylindrical lens CL and the half spherical lens SL.

In the half cylindrical lens CL having a rounded edge portion, a bottom surface contacts the first planarizing layer 270. A cross-sectional surface along the up-down direction has a half circular shape, and a cross-sectional surface along the left-right direction has a rectangular shape having a rounded edge portion or a half elliptical shape having a slanted top side.

As a result, a light emitted through a top surface of an interface between the half cylindrical lens CL and the half spherical lens SL is focused along the up-down direction and is not focused (is diffused) along the left-right direction. In addition, a light emitted through a top surface of an edge portion or a slanted portion of the half cylindrical lens CL is focused along the up-down direction and is focused to a slanted surface instead of a front surface along the left-right direction. Accordingly, diffusion of a light along the left-right direction increases.

In the half spherical lens SL, a bottom surface contacts the first planarizing layer 270, and a cross-sectional surface along the up-down and left-right directions has a half circular shape.

The light shielding pattern 272 is disposed at an interface between the half cylindrical lens CL and the half spherical lens SL to prevent an interference between lights of the first and second light emitting diodes D1 and D2. Since the light emitted from the first light emitting diode D1 is prevented from entering the half spherical lens SL and the light emitted from the second light emitting diode D2 is prevented from entering the half cylindrical lens CL, a clear switching between the wide view mode and the narrow view mode along the left-right direction is obtained.

FIG. 7 is a table showing a luminance of a viewing angle switchable display device according to an embodiment of the present disclosure.

In FIG. 7, a viewing angle switchable display device of a comparison example includes an encapsulating layer having a transmittance of about 90%, a polarizing layer having a transmittance of about 45%, a view switching film having a transmittance of about 70% and a light control film having a transmittance of about 80%.

A light emitted from an emission area of about 100% of a light emitting diode becomes about 90% due to the encapsulating layer, becomes about 40.5% due to the polarizing layer, becomes about 28.4% due to the view switching film, and becomes about 22.7% due to the light control film. As a result, the light emitted from the light emitting diode of the viewing angle switchable display device of a comparison example has a final emission ratio of about 22.7% and an expectation luminance of about 672 nit.

The viewing angle switchable display device 110 according to an embodiment of the present disclosure includes the integrated lens IL of the half spherical lens SL having a light collection efficiency of about 327% and the half cylindrical lens CL having a light collection efficiency of about 165%, the encapsulating layer 254 having a transmittance of about 90% and a polarizing layer having a transmittance of about 45%.

A light emitted from an emission area of about 32.5% of the first light emitting diode D1 becomes about 106.3% due to the half spherical lens SL of the integrated lens IL, becomes about 95.7% due to the encapsulating layer 254 and becomes about 43.0% due to the polarizing layer. A light emitted from an emission area of about 67.5% of the second light emitting diode D2 becomes about 111.4% due to the half cylindrical lens of the integrated lens IL, becomes about 100.25% due to the encapsulating layer 254 and becomes about 45.1% due to the polarizing layer. As a result, the light emitted from the first light emitting diode D1 of the viewing angle switchable display device 110 according to an embodiment of the present disclosure has a final emission ratio of about 43.0% and an expectation luminance of about 1275.3 nit, and the light emitted from the second light emitting diode D2 of the viewing angle switchable display device 110 according to an embodiment of the present disclosure has a final emission ratio of about 45.1% and an expectation luminance of about 1336.3 nit.

Accordingly, the final expectation ratio of the viewing angle switchable display device 110 according to an embodiment of the present disclosure increases and the luminance of the viewing angle switchable display device 110 according to an embodiment of the present disclosure is improved as compared with the viewing angle switchable display device of a comparison example.

Consequently, in the viewing angle switchable display device 110 according to an embodiment of the present disclosure, since a light is collected or diffused due to the integrated lens IL of the half cylindrical lens CL having a rounded edge portion and the half spherical lens SL corresponding to the first and second light emitting diodes D1 and D2, respectively, the wide view mode and the narrow view mode along the left-right direction are obtained in a state where the luminance increases and the fabrication cost is reduced.

Further, since the light shielding pattern 272 is disposed between the half cylindrical lens CL having a rounded edge portion and the half spherical lens SL in the integrated lens IL, the aperture ratio and the luminance are improved and the interference is minimized or reduced.

It will be apparent to those skilled in the art that various modifications and variations can be made in the display device of the present disclosure without departing from the technical idea or scope of the disclosure. Thus, it is intended that the present disclosure cover the modifications and variations of this disclosure that come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A viewing angle switchable display device, comprising:
   a substrate having at least one subpixel;
   a plurality of transistors in the at least one subpixel on the substrate;
   a first light emitting diode and a second light emitting diode, the first and second light emitting diodes being in the at least one subpixel on the substrate, the first and second light emitting diodes connected to two, respectively, of the plurality of transistors; and
   an integrated lens on the first and second light emitting diodes, the integrated lens including a half cylindrical lens corresponding to the first light emitting diode and a half spherical lens corresponding to the second light emitting diode, the half cylindrical lens and the half spherical lens being connected to each other.

2. The viewing angle switchable display device of claim 1, wherein the integrated lens further includes a light shielding pattern disposed at an interface between the half cylindrical lens and the half spherical lens, and the light shielding pattern contacts the half cylindrical lens and the half spherical lens.

3. The viewing angle switchable display device of claim 1, wherein a cross-sectional surface of the half cylindrical lens along an up-down direction has a half circular shape, and
   wherein a cross-sectional surface of the half cylindrical lens along a left-right direction has one of a rectangular shape having a rounded edge portion or a half elliptical shape having a slanted top side.

4. The viewing angle switchable display device of claim 1, wherein a first anode of the first light emitting diode has a plane shape corresponding to the half cylindrical lens, and a second anode of the second light emitting diode has a plane shape corresponding to the half spherical lens.

5. The viewing angle switchable display device of claim 4, wherein the first anode and the half cylindrical lens have a plane shape of a rectangle having one concave side, and the second anode and the half spherical lens have a plane shape of a circle.

6. The viewing angle switchable display device of claim 1, further comprising:
   an encapsulating layer on the first and second light emitting diodes;
   a first touch electrode and a second touch electrode, the first and second touch electrodes being on the encapsulating layer;
   a first planarizing layer between the first and second touch electrodes and the integrated lens; and
   a second planarizing layer on the integrated lens.

7. The viewing angle switchable display device of claim 6, wherein a refractive index of the integrated lens is greater than a refractive index of the second planarizing layer.

8. The viewing angle switchable display device of claim 1, wherein the plurality of transistors includes:
   a first transistor connected to a high level voltage;
   a second transistor switched according to a second emission signal and connected to the first transistor;
   a third transistor switched according to a third emission signal and connected to the first transistor;
   a fourth transistor switched according to a second gate signal and connected to the first transistor;
   a fifth transistor switched according to the second gate signal and connected to the second transistor;
   a sixth transistor switched according to the second gate signal and connected to the third transistor;
   a seventh transistor switched according to a first emission signal and connected to a reference signal; and
   an eighth transistor switched according to a first gate signal and connected to a data signal.

9. The viewing angle switchable display device of claim 8, wherein a storage capacitor is connected among the first, fourth and eighth transistors in the at least one subpixel,
   wherein the first light emitting diode is connected between the second transistor and a low level voltage, and
   wherein the second light emitting diode is connected between the third transistor and the low level voltage.

10. A viewing angle switchable display device, comprising:
    a substrate having at least one subpixel;
    a plurality of transistors in the at least one subpixel on the substrate;
    a first light emitting diode and a second light emitting diode, the first and second light emitting diodes being in the at least one subpixel on the substrate, the first and second light emitting diodes connected to two, respectively, of the plurality of transistors; and
    an integrated lens on the first and second light emitting diodes, the integrated lens including a half cylindrical lens corresponding to the first light emitting diode and a half spherical lens corresponding to the second light emitting diode,
    wherein the half cylindrical lens has a concave portion, and the half spherical lens contacts a whole of the concave portion to be connected to the half cylindrical lens.

11. The viewing angle switchable display device of claim 10, wherein the integrated lens further includes a light shielding pattern disposed at an interface between the half cylindrical lens and the half spherical lens, and the light shielding pattern contacts the half cylindrical lens and the half spherical lens.

12. The viewing angle switchable display device of claim 10, wherein a cross-sectional surface of the half cylindrical lens along an up-down direction has a half circular shape, and wherein a cross-sectional surface of the half cylindrical lens along a left-right direction has one of a rectangular shape having a rounded edge portion or a half elliptical shape having a slanted top side.

13. The viewing angle switchable display device of claim 10, wherein a first anode of the first light emitting diode has a plane shape corresponding to the half cylindrical lens, and a second anode of the second light emitting diode has a plane shape corresponding to the half spherical lens.

14. The viewing angle switchable display device of claim 13, wherein the first anode and the half cylindrical lens have a plane shape of a rectangle having one concave side, and the second anode and the half spherical lens have a plane shape of a circle.

15. The viewing angle switchable display device of claim 1, further comprising:
an encapsulating layer on the first and second light emitting diodes;
a first touch electrode and a second touch electrode, the first and second touch electrodes being on the encapsulating layer;
a first planarizing layer between the first and second touch electrodes and the integrated lens; and
a second planarizing layer on the integrated lens.

16. The viewing angle switchable display device of claim 15, wherein a refractive index of the integrated lens is greater than a refractive index of the second planarizing layer.

17. A viewing angle switchable display device, comprising:
a substrate having at least one subpixel;
a plurality of transistors in the at least one subpixel on the substrate;
a first light emitting diode and a second light emitting diode, the first and second light emitting diodes being in the at least one subpixel on the substrate, the first and second light emitting diodes connected to two, respectively, of the plurality of transistors; and
an integrated lens on the first and second light emitting diodes, the integrated lens including a half cylindrical lens corresponding to the first light emitting diode and a half spherical lens corresponding to the second light emitting diode,
wherein the half cylindrical lens has a concave portion, and the half spherical lens contacts a whole of the concave portion to be connected to the half cylindrical lens, and
wherein the plurality of transistors includes:
a first transistor connected to a high level voltage;
a second transistor switched according to a second emission signal and connected to the first transistor;
a third transistor switched according to a third emission signal and connected to the first transistor;
a fourth transistor switched according to a second gate signal and connected to the first transistor;
a fifth transistor switched according to the second gate signal and connected to the second transistor;
a sixth transistor switched according to the second gate signal and connected to the third transistor;
a seventh transistor switched according to a first emission signal and connected to a reference signal; and
an eighth transistor switched according to a first gate signal and connected to a data signal.

18. The viewing angle switchable display device of claim 17, wherein a storage capacitor is connected among the first, fourth and eighth transistors in the at least one subpixel,
wherein the first light emitting diode is connected between the second transistor and a low level voltage, and
wherein the second light emitting diode is connected between the third transistor and the low level voltage.

19. The viewing angle switchable display device of claim 17, wherein the integrated lens further includes a light shielding pattern disposed at an interface between the half cylindrical lens and the half spherical lens, and the light shielding pattern contacts the half cylindrical lens and the half spherical lens.

* * * * *